United States Patent [19]

Shuskus

[11] 4,448,633

[45] May 15, 1984

[54] PASSIVATION OF III-V SEMICONDUCTOR SURFACES BY PLASMA NITRIDATION

[75] Inventor: Alexander J. Shuskus, West Hartford, Conn.

[73] Assignee: United Technologies Corporation, Hartford, Conn.

[21] Appl. No.: 445,384

[22] Filed: Nov. 29, 1982

[51] Int. Cl.³ .................... C23C 11/08; C30B 25/10
[52] U.S. Cl. .................... 156/610; 156/DIG. 70; 156/DIG. 99; 427/39; 427/87
[58] Field of Search ............ 427/38, 39, 94, 87; 156/612, 610, DIG. 99, DIG. 70, DIG. 73

[56] References Cited

U.S. PATENT DOCUMENTS 3,551,312 12/1970 Kahng et al. .................... 156/610 X
4,277,320 7/1981 Bequwala et al. ................ 427/94 X
4,298,629 11/1981 Nozaki et al. ........................ 427/39

FOREIGN PATENT DOCUMENTS

WO81/00487 2/1981 PCT Int'l Appl. .................. 427/94

Primary Examiner—Evan K. Lawrence
Attorney, Agent, or Firm—Charles E. Sohl

[57] ABSTRACT

Type III-V compound semiconductor surfaces are passivated by exposure to a low pressure nitrogen plasma. The III element forms III element-nitride. Nitridation is performed in two steps; the first being at a low temperature to prevent decomposition of the surface by loss of V element, and the second step being performed at an elevated temperature at which nitridation proceeds at a faster rate. The resultant articles have a III element-nitride surface layer which protects the articles from environmental degradation while reducing the surface state density and permitting inversion of the surface layer.

6 Claims, 2 Drawing Figures

PASSIVATION OF III-V SEMICONDUCTOR SURFACES BY PLASMA NITRIDATION

DESCRIPTION

1. Technical Field

This invention relates to the surface passivation of III-V type semiconductors, and particularly to gallium arsenide.

2. Background Art

Gallium arsenide and other III-V type semiconductors are attractive candidate materials for the fabrication of high performance semiconductor components. These materials offer the promise of high operational speed, but suffer from a susceptibility to environmental degradation. Efforts to date to surface passivate the III-V type semiconductors have not, to our knowledge, been entirely successful. Silicon semiconductor surfaces can be passivated by the development of a native oxide layer. However, the native oxide layers which can be formed on III-V compounds exhibit significant charge trapping under bias stress and, therefore, these native oxides are relatively ineffective as the surface passivation agent. In the case of gallium arsenide, growth of a native oxide layer leads to the formation of extrinsic defects yielding a high surface state density. In addition, most native III-V oxides are susceptible to environmental attack, for example, by moisture.

A paper entitled "Reactive Sputtering of Gallium Nitride Thin Films for GaAs MIS Structures" by T. Hariou et al, published in *Applied Physics Letter*, Vol. 32, No. 4, Feb. 15, 1978, page 252 suggests that thin films of gallium nitride can be produced by reactive sputtering of gallium in a nitrogen atmosphere to produce a surface coating of gallium nitride.

Report No. AFOSR-TR-80-1029, entitled "Passivation of GaAs Surfaces" by J. I. Pankove prepared for the Air Force Office of Scientific Research in August of 1980, suggests the nitridation of gallium arsenide using a nitrogen plasma while thermally heating the gallium arsenide to a temperature of about 650° C. The results reported are inconclusive, and apparently no beneficial results were obtained. Indications in the reference are that a rough, pitted surface was produced, suggesting that substantial surface decomposition occurred.

An article entitled "A Proposed Hydrogenation/Nitridation Passivation Mechanism for GaAs and Other III-V Semiconductor Devices Including GaAs Long Wave Length Photodetectors" by F. Capasso and G. F. Williams was published in the *Journal of the Electrochemical Society*, April 1982, starting at page 822. This article suggests that gallium arsenide surfaces may be passivated by a combination of hydrogenation and nitrogenation in a plasma atmosphere. The hydrogenation step apparently removes the arsenic from the surface through the formation of a volatile arsenic hydride compound.

U.S. Pat. No. 4,331,737 by Nishizawa et al suggests the deposition of an oxinitride film on a gallium arsenide surface for surface passivation. The species which comprise the film are provided in gaseous form and reacted in a plasma zone in order to deposit the film on the gallium arsenide surface.

SUMMARY OF THE INVENTION

The III-V type semiconductors are compounds such as GaAs, InSb, InP, InAs and $In_xGa_{x-1}As$, where In and Ga are in Group III in the Periodic Table, and As, Sb and P are in Group V.

III-V semiconductor surfaces are passivated by nitridation in a nitrogen plasma in a two-step process. In the first step, performed at a temperature of about 450° C., a thin layer of III-element nitride is produced which serves to protect the III-V surface from volatilization, and resulting V element depletion, at a higher temperature. The second step is performed at a higher temperature of about 650° C.; at this temperature, a thicker layer of III-element nitride can be provided in a reasonable time period. The resultant article consists of III-V compound of very near stoichiometric proportions coated with a thin, continuous adherent layer of III-element nitride. The smoothness of the III-element nitride layer replicates the smoothness of the starting III-V surface. Type III-V semiconductor components so passivated display resistance to environmental attack by oxygen, nitrogen and water vapor and display the ability to have their surfaces inverted by the application of an electric field. This latter property suggests the ability to fabricate III-V based MIS devices, especially GaAs type devices. Both amorphous and epitaxial crystalline surface layers can be obtained by controlling process parameters.

The foregoing, and other features and advantages of the present invention, will become more apparent from the following description and accompanying drawing.

BEST MODE FOR CARRYING OUT THE INVENTION

Figure 1:
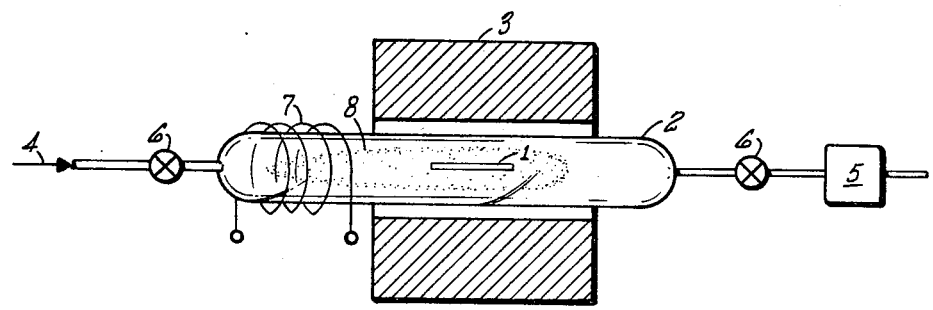
FIG. 1 is a schematic illustration of an apparatus which can be used to produce the surface passivating coating of the present invention.

The coating of the invention may be applied using an apparatus as schematically illustrated in FIG. 1. The apparatus is meant to be exemplary and illustrative rather than limiting. Referring now to FIG. 1, the III-V compound 1 to be passivated is located within an evacuated chamber 2 and is arranged to be heated by heating means 3. Nitrogen gas 4 (or gas which dissociates to produce nitrogen without other deleterious species) is introduced to the evacuated chamber 2 and flows through the chamber 2 during the nitridation process. By means of a vacuum pump 5 and appropriate valving 6, the pressure within the chamber 2 is maintained at a controlled low pressure. The nitrogen 4 flows into the chamber 2 and through a portion 6 of the chamber 2 surrounded by an RF induction coil 7. When the coil 7 is energized, the nitrogen within the coil 7 is converted into a plasma 8. The plasma 8 extends substantially beyond the coil 7 and the sample 1 is positioned so that it is within the plasma 8.

By introducing RF energy into the nitrogen, the nitrogen atoms are ionized and have effective energies equivalent to those which would be possessed by nitrogen atoms thermally heated to temperatures on the order of 5000°-8000° C. It is this high energy which permits the nitridation of the III-V material at low actual substrate temperatures. In the absence of a plasma, nitriding temperatures in excess of 800° C. are required and III-V surfaces are not stable at temperatures much in excess of about 600° C. Plasma can be generated through the use of inductive means as described herein, as well as through the use of capacitive means. Such capacitive means would consist of one or more pairs of plates located within the low pressure chamber and connected to a source of RF energy. While I believe that equivalent results could be obtained through capacitive coupling, I have not pursued this technique in view of the exceptional results obtained through induction coupling. I also believe that gases, such as ammonia, which dissociate to form nitrogen plasma can be employed in partial or complete substitution for nitrogen.

The III-V semiconductor to be nitrided is placed within the chamber and appropriately positioned so that it can be thermally heated in a controlled fashion, while simultaneously lying within the plasma zone. The system is evacuated, purged and then the desired operating conditions of nitrogen flow and pressure are established. Nitrogen pressures of 0.01 to 10 torr are usable; pressures at the low end of the range (i.e. 0.01 to 0.5 torr) produce polycrystalline III-element nitride layers while pressures at the upper end of the range (i.e. 1 to 10 torr) produce single crystal epitaxial III-element nitride layers. The III-V substrate is thermally heated to the desired temperature and the plasma is established by applying RF energy to the coupling means. An essential feature of the invention is that the III-V semiconductor is initially nitrided at a low temperature, from about 400° C. to about 500° C., in order to establish an initial thin stoichiometric III element nitride surface layer without disturbing the stoichiometry of the surface. Indications are that the initial surface layer need not exceed about 100 Å in thickness and thicknesses of from 20–50 Å are probably sufficient. This initial layer prevents significant depletion of the III-V compound in the V-element. Having deposited this initial layer, the temperature can then be increased to above 500° C. (e.g. 500° C.–700° C.) so that nitridation can occur at a much higher rate. Surface passivation and surface protection can be obtained for III element nitride layers in excess of about 200 Å in thickness, i.e. 200 Å–1000 Å thick.

Following the second nitriding step, the nitrided III-V article is preferably annealed in hydrogen at about 300° C. for one hour. This hydrogen anneal results in a further lowering of the surface state density. An essential benefit of the present invention is that the III-V surface layer forms without significant depletion of the III-V substrate layer in the V element. Further, the III-V layer forms without any effect on the surface morphology of the III-V article. This replication of initial surface finish is important since increased surface roughness would result in poor device yield since the subsequent photolithographic operations could not be carried out properly. The process of the present invention can be understood through references to the following illustrative example.

EXAMPLE

Figure 2:
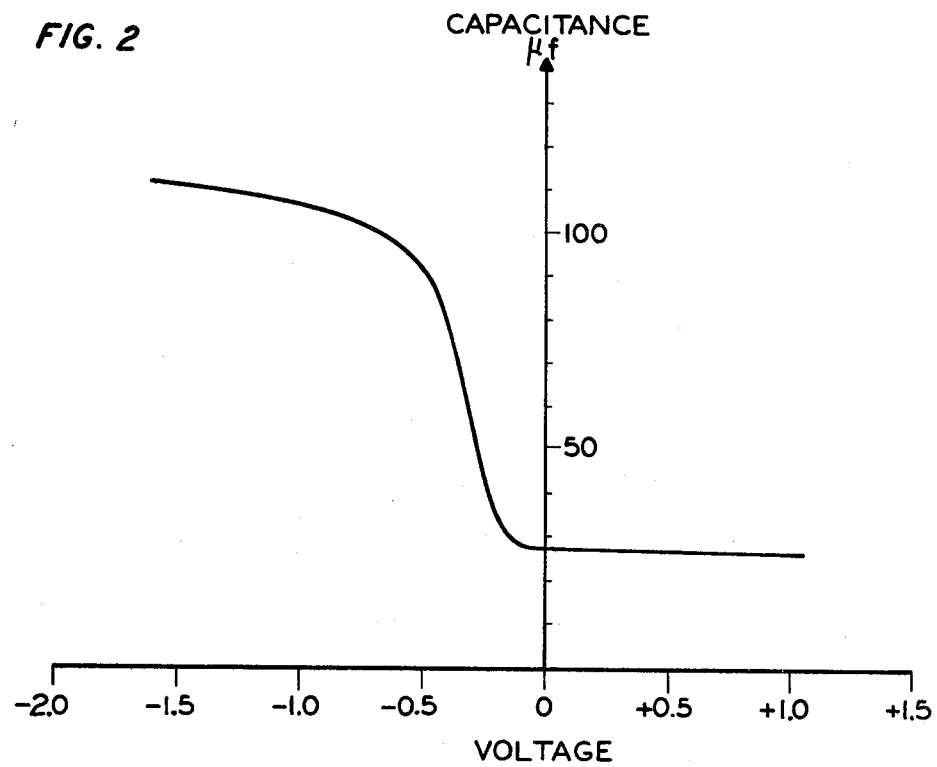
FIG. 2 is a plot of capacitance versus applied voltage for gallium arsenide, passivated by the invention process, illustrating surface inversion.

Samples of gallium arsenide and indium arsenide were placed in a two-inch (5.08 cm) quartz tube. The samples were located within the tube inside surrounded by a resistively heated furnace. Surrounding the tube adjacent the susceptor was a four and one-half turn induction coil which was connected to a 100 watt, 13.5 mhz RF source. The quartz tube was evacuated and purged with high purity dry nitrogen. The nitrogen pressure was reduced to about 0.5 torr, while the resistive heating means was adjusted to provide a sample temperature of about 450° C. The 13.5 mhz source was applied to the RF induction coil and a glow discharge resulted which enveloped the sample. After a period of one-half hour, the substrate temperature was raised to about 650° C. and the process was continued for two hours. Following this, the furnace was cooled, purged with hydrogen and the sample was heated to 300° C. in a hydrogen atmosphere for about 30 minutes. Following this, the sample was removed from the furnace and the gallium arsenide sample was evaluated for surface inversion by measuring capacitance as a function of applied voltage. The resultant curve is shown as FIG. 2 and clearly illustrates that surface inversion resulted. Electron diffraction results showed that the surface coating was a single crystal with the hexagonal structure of GaN rather than the cubic storage of GaAs. Optical inspection of the indium arsenide surface revealed a smooth surface having a coating thereon (presumably InN) as indicated by the presence of an interference pattern.

Although this invention has been shown and described with respect to detailed embodiments thereof, it will be understood by those skilled in the art that various changes in form and detail thereof may be made without departing from the spirit and scope of the claimed invention.

I claim:
1. Method for producing surface passivating layers on III-V semiconductor articles by nitriding the surface of the articles including the steps of:
   (a) heating the III-V article to a temperature greater than about 400° C. and less than 500° C. while contacting the III-V article with a nitrogen plasma, said plasma having been produced by ionizing nitrogen gas having a pressure of from about 0.01 to about 10 torr, to provide an initial III-nitride layer having a thickness of about 20–100 Å, and
   (b) heating the III-V semiconductor to a temperature greater than 500° C. and less than about 700° C. while contacting the III-V surface with a nitrogen plasma to produce a thicker nitride layer, said plasma having been produced by ionizing nitrogen gas having a pressure of from about 0.01 to about 10 torr, so that the total thickness of the nitride layer is from about 200 to about 1000 Å.

2. A method as in claim 1 in which, following the second nitriding step, the article is annealed in hydrogen.

3. A method as in claim 2 in which the III-V semiconductor is GaAs and the III-nitride is GaN.

4. A method as in claim 1 in which the III-V semiconductor is GaAs and the III-nitride is GaN.

5. A method as in claim 1 in which the pressure of the nitrogen from which the plasma is produced in steps (a) and (b) is from about 0.01 to about 0.5 torr and the resulting III-nitride coating is polycrystalline.

6. A method as in claim 1 in which the pressure of the nitrogen from which the plasma is produced in steps (a) and (b) is from about 1 to about 10 torr and the resulting III-nitride coating is a single crystal.

* * * * *